(12) United States Patent
Kinoshita et al.

(10) Patent No.: US 12,355,444 B2
(45) Date of Patent: Jul. 8, 2025

(54) GATE DRIVE CIRCUIT, AND SEMICONDUCTOR BREAKER

(71) Applicant: Panasonic Intellectual Property Management Co., Ltd., Osaka (JP)

(72) Inventors: Yusuke Kinoshita, Kyoto (JP); Takashi Ichiryu, Osaka (JP); Hidetoshi Ishida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 120 days.

(21) Appl. No.: 18/461,126

(22) Filed: Sep. 5, 2023

(65) Prior Publication Data
US 2023/0412154 A1 Dec. 21, 2023

Related U.S. Application Data

(62) Division of application No. 17/626,296, filed as application No. PCT/JP2020/027153 on Jul. 10, 2020, now Pat. No. 11,791,803.

(Continued)

(51) Int. Cl.
*H03K 3/012* (2006.01)
*H03K 17/04* (2006.01)

(52) U.S. Cl.
CPC ............. *H03K 3/012* (2013.01); *H03K 17/04* (2013.01)

(58) Field of Classification Search
CPC ...... H03K 3/012; H03K 17/04; H03K 17/163; H03K 17/164; H02M 1/08; H02M 1/32
See application file for complete search history.

(56) References Cited

U.S. PATENT DOCUMENTS

| 6,180,959 B1 | 1/2001 | Iwasaki et al. |
| 6,522,089 B1 * | 2/2003 | Duong ............... H05B 41/2928 |
| | | 315/307 |

(Continued)

FOREIGN PATENT DOCUMENTS

| JP | H01-183214 A | 7/1989 |
| JP | H10-327059 A | 12/1998 |

(Continued)

OTHER PUBLICATIONS

International Search Report and Written Opinion issued on Aug. 18, 2020, in International Patent Application No. PCT/JP2020/027153; with English translation.

(Continued)

*Primary Examiner* — Sibin Chen
(74) *Attorney, Agent, or Firm* — Rimon P.C.

(57) ABSTRACT

A gate drive circuit includes: an input terminal; a first circuit path inserted into a line connecting the input terminal and a gate of a power transistor; a second circuit path connected in parallel to the first circuit path; and a third circuit path connected in parallel to the second circuit path. The first circuit path includes a gate resistor (Rgon). The second circuit path includes a first capacitor and a first resistor connected in series. The third circuit path includes a second capacitor and a second resistor connected in series. The second capacitor has a capacitance value greater than a capacitance value of the first capacitor. The second resistor has a resistance value greater than a resistance value of the first resistor. The gate resistor (Rgon) has a resistance value greater than the resistance value of the second resistor.

4 Claims, 13 Drawing Sheets

Related U.S. Application Data

(60) Provisional application No. 62/875,334, filed on Jul. 17, 2019.

(56) References Cited

U.S. PATENT DOCUMENTS

| | | | |
|---|---|---|---|
| 10,218,258 B1* | 2/2019 | Nagl | H02M 1/08 |
| 11,095,283 B2 | 8/2021 | Inoue | |
| 2003/0180997 A1 | 9/2003 | Nakayama et al. | |
| 2011/0215840 A1* | 9/2011 | Machida | H03K 3/00 |
| | | | 327/309 |
| 2014/0042871 A1* | 2/2014 | Lee | H03K 7/08 |
| | | | 310/317 |
| 2014/0145658 A1 | 5/2014 | Heo et al. | |
| 2016/0079785 A1 | 3/2016 | Kinzer et al. | |
| 2018/0013416 A1 | 1/2018 | Sicard | |
| 2018/0034456 A1 | 2/2018 | Lee | |

FOREIGN PATENT DOCUMENTS

| | | |
|---|---|---|
| JP | 2000-232347 A | 8/2000 |
| JP | 2003-284318 A | 10/2003 |
| JP | 3964833 B2 | 8/2007 |
| JP | 2010-220325 A | 9/2010 |
| JP | 2012-239361 A | 12/2012 |

OTHER PUBLICATIONS

D. Bortis, et al., "Double-stage Gate Drive Circuit for Parallel Connected IGBT Modules", IEEE Transactions on Dielectrics and Electrical Insulation, vol. 16, No. 4, Aug. 2009; pp. 1020-1027, with coverpage.

Notice of Allowance dated Jun. 8, 2023 issued in U.S. Appl. No. 17/626,296.

* cited by examiner

GATE DRIVE CIRCUIT, AND SEMICONDUCTOR BREAKER

CROSS REFERENCE TO RELATED APPLICATIONS

This application is a Divisional of U.S. patent application Ser. No. 17/626,296, filed on Jan. 11, 2022, which is the U.S. National Phase under 35 U.S.C. § 371 of International Patent Application No. PCT/JP2020/027153, filed on Jul. 10, 2020, claiming the benefit of priority of U.S. Provisional Patent Application No. 62/875,334, filed on Jul. 17, 2019, the entire contents of which are hereby incorporated by reference.

TECHNICAL FIELD

The present disclosure relates to a gate drive circuit that drives a power transistor and a semiconductor breaker.

BACKGROUND ART

In data processing centers and communication bureaus, a reliable, high-quality system is in demand. In a direct current power supply system used in such a system, electric power supplied from a host power source device is branched by a current distribution device to supply electric power to a plurality of loads. This current distribution device includes a protective device for the event of a short-circuit. Types of such a protective device include, for example, an electric fuse, a molded-case circuit breaker (MCCB), and a protective device that uses a semiconductor power transistor (hereinafter referred to as a semiconductor breaker). For example, when an overcurrent is detected, the semiconductor breaker controls a gate voltage of the semiconductor power transistor, and limits the overcurrent by turning the semiconductor power transistor off.

The semiconductor power transistor is controlled by a gate drive circuit that supplies, to a gate, a signal that drives switching operation. For example, Patent Literatures (PTLs) 1 through 7 and Non-Patent Literature (NPL) 1 disclose such a gate drive circuit.

CITATION LIST

Patent Literature

[PTL 1] Japanese Patent No. 3964833
[PTL 2] Japanese Patent No. 5925434
[PTL 3] Japanese Unexamined Patent Application Publication No. H10-327059
[PTL 4] Japanese Unexamined Patent Application Publication No. 2010-220325
[PTL 5] Japanese Unexamined Patent Application Publication No. 2003-284318
[PTL 6] Japanese Unexamined Patent Application Publication No. 2000-232347
[PTL 7] Japanese Unexamined Patent Application Publication No. H1-183214

Non-Patent Literature

[NPL 1] Bortis, D., Steiner, P., Biela, J., Kolar, J. W. (August 2009). Double-stage gate drive circuit for parallel connected IGBT modules. *IEEE Transactions on Dielectrics and Electrical Insulation*, 16(4).

SUMMARY OF INVENTION

Technical Problem

However, if a current is quickly interrupted in a semiconductor breaker, a surge voltage caused by energy accumulated in the parasitic inductance of a load circuit is applied to a device. When the surge voltage exceeds withstand pressure, the surge voltage may break the semiconductor breaker. As described, a quick current interruption reduces the reliability of semiconductor breakers.

On the contrary, a slow current interruption extends a Miller period during which a gate voltage of a semiconductor power transistor stays flat. Since a drain-to-source current is uninterrupted during the Miller period, an overcurrent may break the semiconductor breaker. As described, a slow current interruption also reduces the reliability of semiconductor breakers.

In view of the above, the present disclosure aims to provide a gate drive circuit and a semiconductor breaker whose reliability is increased by the control of a surge voltage and shortening of a Miller period.

Solution to Problem

In order to achieve the above-described aim, a gate drive circuit according to an aspect of the present disclosure includes: an input terminal; a first circuit path inserted into a line connecting the input terminal and a gate of a power transistor; a second circuit path connected in parallel to the first circuit path; and a third circuit path connected in parallel to the second circuit path, wherein the first circuit path includes a gate resistor, the second circuit path includes a first capacitor and a first resistor connected in series, the third circuit path includes a second capacitor and a second resistor connected in series, the second capacitor has a capacitance value greater than a capacitance value of the first capacitor, the second resistor has a resistance value greater than a resistance value of the first resistor, and the gate resistor has a resistance value greater than the resistance value of the second resistor.

In addition, a semiconductor breaker according to an aspect of the present disclosure includes the above gate drive circuit, and the power transistor.

Advantageous Effects of Invention

According to a gate drive circuit and a semiconductor breaker of the present disclosure, the reliability can be increased by the control of a surge voltage and shortening of a Miller period.

DESCRIPTION OF EMBODIMENTS

[Background of Attaining an Aspect of the Present Disclosure]

The inventors have found out about occurrences of the above-described problems in a gate drive circuit described in the background art section. Hereinafter, these problems will be described with reference to FIG. 1A through FIG. 1C.

Figure 1A:
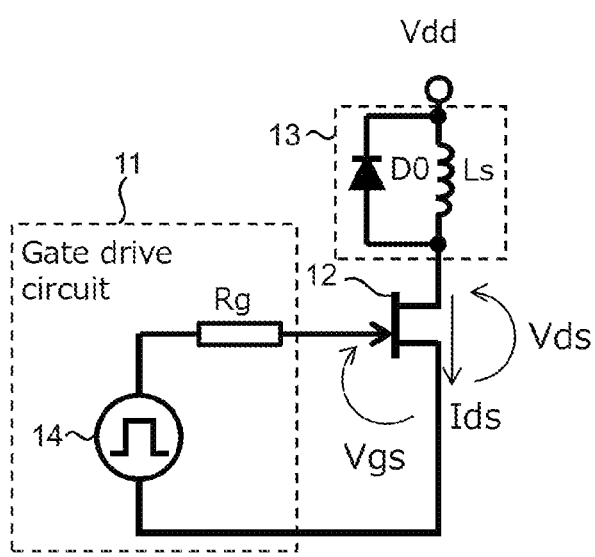
FIG. 1A is a circuit diagram illustrating a power switching system including a gate drive circuit according to a comparative example.

FIG. 1A is a circuit diagram illustrating a power switching system including a gate drive circuit according to a comparative example. The power switching system illustrated in FIG. 1A includes load circuit 13, power transistor 12, and gate drive circuit 11.

Load circuit 13 is a typical equivalent circuit including diode DO and parasitic inductor Ls.

Power transistor 12 is a power device for electric power control.

Gate drive circuit 11 includes control circuit 14 and gate resistor Rg.

Control circuit 14 generates a gate signal that is a rectangular-wave signal for switching power transistor 12 on or off, and supplies the gate signal to a gate of power transistor 12 via gate resistor Rg.

Gate resistor Rg mitigates an abrupt change in a gate signal. Gate resistor Rg increases a rise time and a fall time. In other words, gate resistor Rg is a resistor for making an adjustment for increasing the slew rate of a rising edge and a falling edge.

Figure 1B:
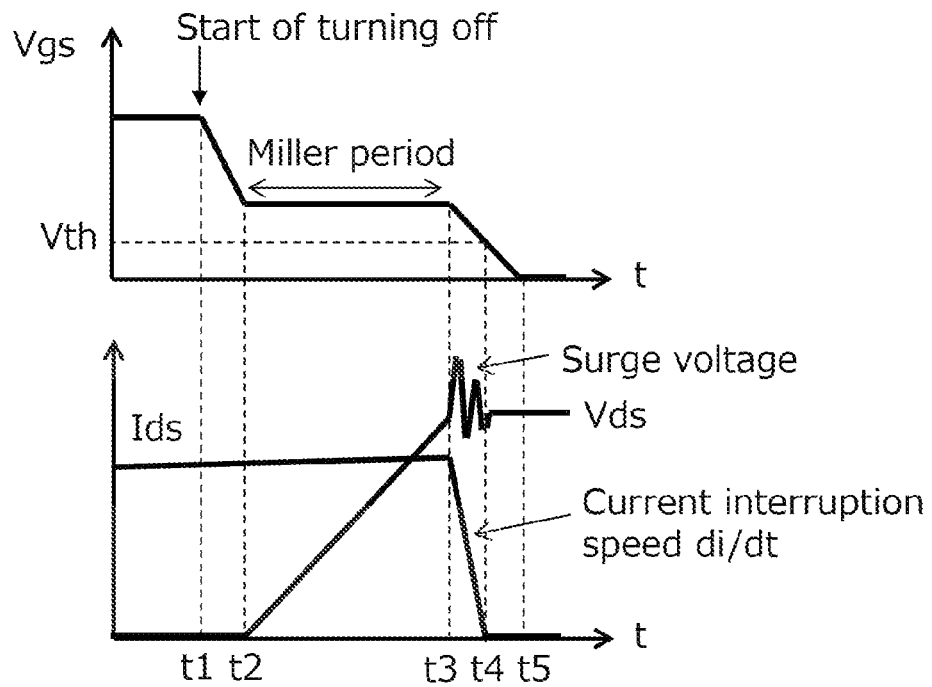
FIG. 1B is a diagram illustrating a waveform of each of a gate-to-source voltage, a drain-to-source voltage, and a drain-to-source current in the gate drive circuit according to the comparative example.

FIG. 1B is a diagram schematically illustrating a waveform of each of gate-to-source voltage Vgs, drain-to-source voltage Vds, and drain-to-source current Ids in the gate drive circuit according to the comparative example. The horizontal axes in the upper section and the lower section of FIG. 1B represent time. The vertical axis in the upper section represents a gate-to-source voltage during a turn-off time of power transistor 12. Hereinafter, gate-to-source voltage Vgs may be simply referred to as gate voltage Vgs. The vertical axis in the lower section represents drain-to-source voltage Vds and drain-to-source current Ids. Hereinafter, drain-to-source voltage Vds may be simply referred to as drain voltage Vds, and drain-to-source current Ids may be simply referred to as drain current Ids. Vth denotes a threshold voltage of power transistor 12.

Time t1 is the starting point of a fall of a gate signal supplied from control circuit 14. In other words, time t1 is the starting point at which power transistor 12 starts to turn off. Time t4 is the point at which the turning off completes. The change observed from time t1 to time t4 is not monotonous. From time t1 to t4, a Miller period during which gate voltage Vgs stays flat occurs.

Here, a Miller period will be described. When gate voltage Vgs approaches threshold voltage Vth when power transistor 12 is turned on or off, gate-to-drain parasitic capacitance Cgd (has a greater effect than the effect of an actual capacitance value due to the Miller effect) is either charged or discharged, and thus a period during which gate voltage Vgs stays flat occurs. This is a Miller period. Miller voltage Vgm is gate voltage Vgs produced during a Miller period. A Miller period is a period during which drain-to-source voltage Vds changes, and the Miller period ends when drain-to-source voltage Vds reaches the final value.

As illustrated in FIG. 1B, when the change in a current from the completion of a Miller period onward is called current interruption speed di/dt, a surge voltage due to parasitic inductor Ls is proportional to Ls (di/dt). That is, the magnitude of the surge voltage is proportional to an inductance of parasitic inductor Ls, and is also proportional to current interruption speed di/dt. When the surge voltage exceeds withstand pressure, the surge voltage may break the semiconductor breaker. Accordingly, current interruption speed di/dt needs to be decreased.

Figure 1C:
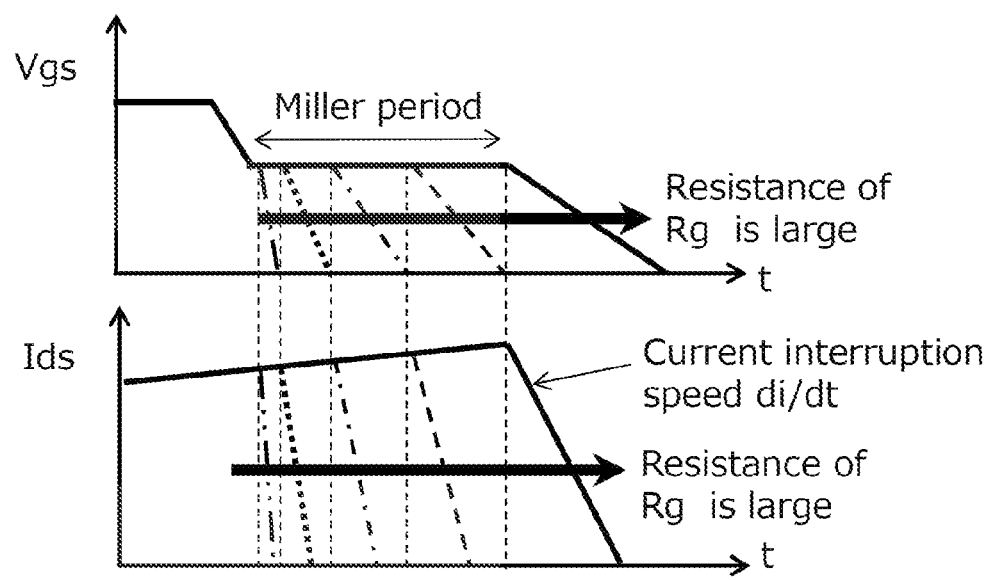
FIG. 1C is a diagram illustrating a characteristic of each of a gate-to-source voltage and a drain-to-source current with respect to the magnitude of resistance of gate resistance according to the comparative example.

FIG. 1C is a diagram illustrating characteristics of each of gate-to-source voltage Vgs and drain-to-source current Ids with respect to the magnitude of resistance of gate resistor Rg according to the comparative example. The two-dot-chain line, dotted line, one-dot-chain line, dashed line, and solid line illustrated in FIG. 1C each correspond to the magnitude of a resistance value of gate resistor Rg in the stated order. As illustrated in FIG. 1C, a Miller period is short when a resistance value of gate resistor Rg is small, and a Miller period is long when a resistance value of gate resistor Rg is large. Since drain current Ids is uninterrupted during a Miller period, a semiconductor breaker may be broken due to an overcurrent. Accordingly, a Miller period needs to be shortened.

However, as illustrated in FIG. 1C, current interruption speed di/dt increases when a resistance value of gate resistor Rg is small. Accordingly, a trade-off relationship is established between a reduction in a surge voltage and shortening of a Miller period.

In view of the above, the present disclosure provides a gate drive circuit and a semiconductor breaker whose reliability is increased by enabling both a reduction in a surge voltage and shortening of a Miller period.

In order to solve the problem, a gate drive circuit according to an aspect of the present disclosure includes: an input terminal; a first circuit path inserted into a line connecting the input terminal and a gate of a power transistor; a second circuit path connected in parallel to the first circuit path; and a third circuit path connected in parallel to the second circuit path. The first circuit path includes a gate resistor, the second circuit path includes a first capacitor and a first resistor connected in series, and the third circuit path includes a second capacitor and a second resistor connected in series. The second capacitor has a capacitance value greater than a capacitance value of the first capacitor. The second resistor has a resistance value greater than a resistance value of the first resistor. The gate resistor has a resistance value greater than the resistance value of the second resistor.

With this, it is possible to shorten a Miller period and to reduce a surge voltage (i.e., current interruption speed di/dt can be decreased). In other words, the reliability of a power transistor can be increased.

For example, during a process of turning the power transistor off, the second circuit path quickly discharges part of electric charge from gate capacitance of power transistor 2. With this, it is possible to shorten a Miller period.

For example, subsequent to the second circuit path discharging the part of the electric charge, the third circuit path discharges another part of the electric charge from the gate capacitance at a speed slower than a speed of the second circuit path discharging the part of the electric charge. Since this decreases a current interruption speed, it is possible to reduce a surge voltage.

It should be noted that since the resistance value of a gate resistor in a first circuit path is greater than that of a second resistor, the resistance value of the gate resistor hardly contributes to the discharge of electric charge during a turn-off time of the power transistor.

In addition, a semiconductor breaker according to an aspect of the present disclosure includes the above-described gate drive circuit, and the power transistor.

With this, it is possible to shorten a Miller period and to reduce a surge voltage. In other words, the reliability of a power transistor can be increased.

Hereinafter, embodiments will be described in detail with reference to the drawings.

Note that the embodiments below each describe a general or specific example. The numerical values, shapes, materials, elements, the arrangement and connection of the elements, steps, the order of the steps, etc. described in the following embodiments are mere examples, and thus are not intended to limit the present disclosure. Therefore, among the elements in the following embodiments, elements not recited in any of the independent claims defining the broadest concept of the present disclosure are described as optional elements.

EMBODIMENT

[1. Configuration]

Figure 2A:
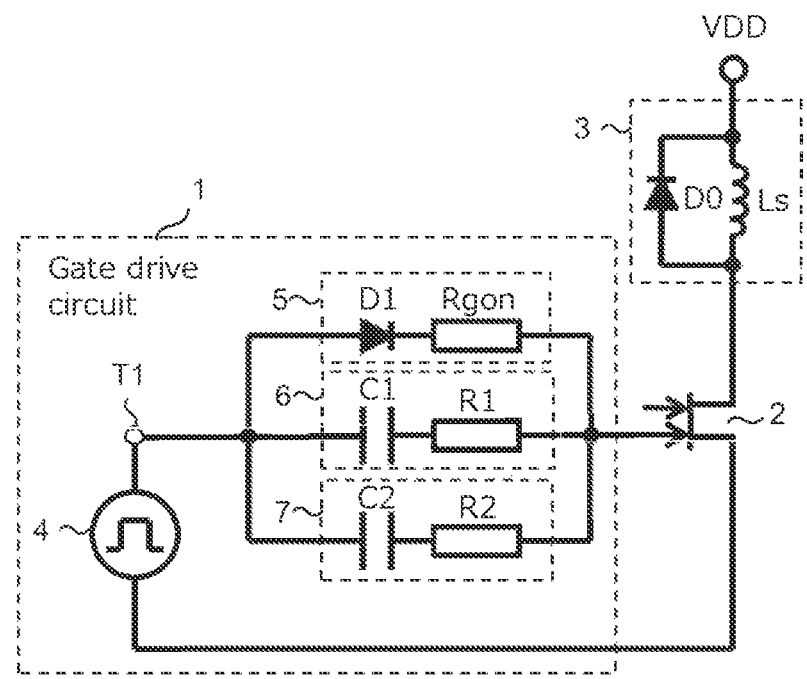
FIG. 2A is a diagram illustrating an example of a configuration of a power switching system including a gate drive circuit according to an embodiment.

FIG. 2A is a diagram illustrating an example of a configuration of a power switching system including a gate drive circuit according to an embodiment. The power switching system illustrated in FIG. 2A is, for example, a semiconductor breaker. The power switching system illustrated in FIG. 2A includes load circuit 3, power transistor 2, and gate drive circuit 1.

Load circuit 3 is a typical equivalent circuit including diode D0 and parasitic inductor Ls.

Power transistor 2 is a power device for electric power control, and is a semiconductor switching element that can withstand pressure of, for example, several hundred volts. Power transistor 2 may be, for example, an insulated gate bipolar transistor (IGBT), a silicon carbide (SiC) field-effect transistor (FET), or a gallium nitride (GaN) transistor. Moreover, power transistor 2 may have a p-type gate structure, may be a GaN bidirectional switch having a p-type dual gate structure, or may be a metal-oxide-semiconductor field-effect transistor (MOSFET).

Gate drive circuit 1 drives power transistor 2 by charging and discharging gate capacitance of power transistor 2. For this reason, gate drive circuit 1 includes input terminal T1, control circuit 4, first circuit path 5, second circuit path 6, and third circuit path 7. Note that the gate capacitance of power transistor 2 includes parasitic capacitance such as gate-to-drain parasitic capacitance.

Control circuit 4 generates a gate signal that is a rectangular-wave signal for switching power transistor 2 on or off, and supplies the gate signal to a gate of power transistor 2 via input terminal T1 and parallel circuits including first circuit path 5, second circuit path 6, and third circuit path 7.

First circuit path 5 is inserted into a line connecting input terminal T1 and the gate of power transistor 2. First circuit path includes diode D1 and gate resistor Rgon connected in series. First circuit path 5 mainly contributes to turning on of and the ON state of power transistor 2, and hardly contributes to turning off of power transistor 2.

Second circuit path 6 is connected in parallel to first circuit path 5. Second circuit path 6 includes first capacitor C1 and first resistor R1 connected in series. Capacitance and resistance of second circuit path 6 are lower than those of third circuit path 7. Since first resistor R1 has low resistance, second circuit path 6 discharges, in the first place, part of electric charge from the gate capacitance of power transistor 2 during a process of turning power transistor 2 off at a speed faster than third circuit path 7 discharging electric charge. This quick discharge performed by second circuit path 6 can shorten a Miller period. In addition, by appropriately setting the capacitance value of first capacitor C1, it is possible to limit an electric charge amount discharged during the quick discharge. For example, during the process of turning power transistor 2 off, second circuit path 6 discharges a first electric charge amount from the gate capacitance of power transistor 2. The first electric charge amount is set to be less than a second electric charge amount that is discharged from the gate capacitance of power transistor 2 from the start of turning power transistor 2 off until a Miller period is completed.

Third circuit path 7 is connected in parallel to second circuit path 6. Third circuit path 7 includes second capacitor C2 and second resistor R2 connected in series. Here, the capacitance value of second capacitor C2 is greater than that of first capacitor C1. Moreover, the resistance value of second resistor R2 is greater than that of first resistor R1. In addition, the resistance value of gate resistor Rgon is greater than that of second resistor R2. In the process of turning power transistor 2 off, third circuit path 7 discharges another part of electric charge from the gate capacitance subsequent to second circuit path 6 discharging the electric charge at a speed slower than second circuit path 6 discharging the electric charge. This decreases current interruption speed di/dt, thereby reducing a surge voltage.

Next, a signal waveform in the process of turning power transistor 2 off will be described.

Figure 2B:
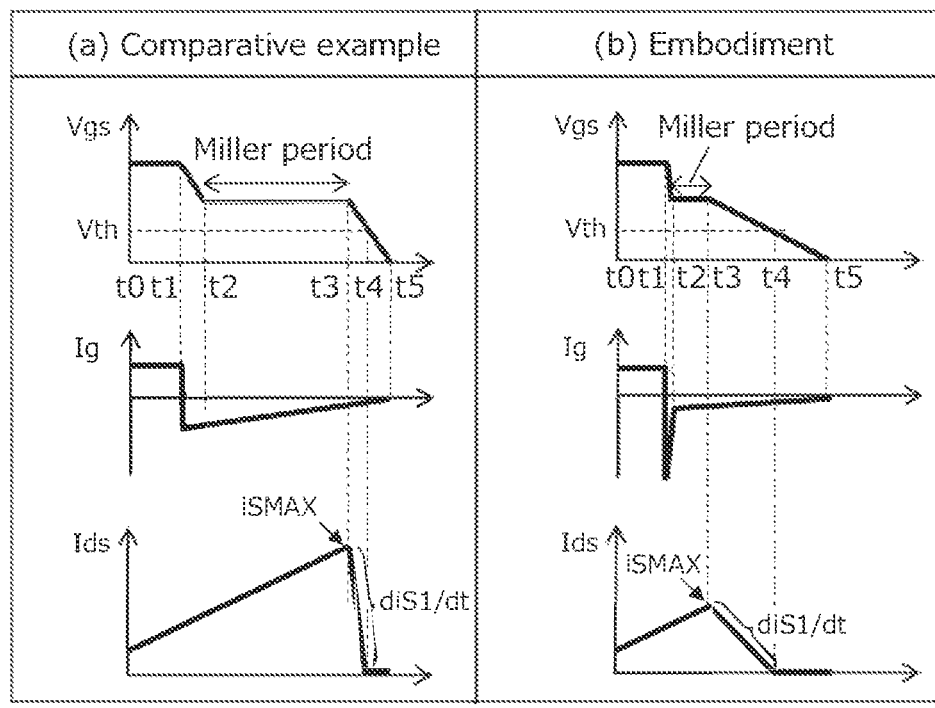
FIG. 2B is a diagram illustrating a waveform chart of each of a gate voltage, a gate current, and a source current in the gate drive circuits according to the comparative example and the embodiment.

FIG. 2B is a diagram illustrating a waveform chart of each of gate voltage Vgs, gate current Ig, and source current Ids in the gate drive circuits according to the comparative example and the embodiment. A gate drive circuit used in the comparative example section illustrated in (a) of FIG. 2B corresponds to gate drive circuit 11 illustrated in FIG. 1A. A gate drive circuit used in the embodiment section illustrated in (b) of FIG. 2B corresponds to gate drive circuit 1 illustrated in FIG. 2A.

In (a) and (b) of FIG. 2B, time t1 denotes the starting point of turning the power transistors off, and time t5 denotes the completion point of turning the power transistors off. A time from time t2 to time t3 indicates a Miller period. Time t4 denotes a time at which gate voltage Vgs reached threshold voltage Vth. In other words, power transistor 2 is brought into the OFF state from time t4 onward.

As illustrated in (b) of FIG. 2B, a Miller period is shortened and current interruption speed di/dt is decreased in gate drive circuit 1 according to the embodiment, compared to the Miller period and current interruption speed di/dt in gate drive circuit 11 according to the comparative example illustrated in FIG. 1A. A decrease in current interruption speed di/dt means a reduction in a surge voltage.

Second circuit path 6 contributes to shortening of the Miller period. For example, the magnitude of the capacitance value of first capacitor C1 in second circuit path 6 is set such that it is possible to absorb electric charge discharged by the gate capacitance from the start of turning power transistor 2 off at time t1 to before the Miller period completes at time t3. In addition, first resistor R1 is set to a comparatively small resistance value such that electric charge can quickly transfer. With this, second circuit path 6 quickly discharges the gate capacitance from the start of turning power transistor 2 off at time t1 to before the Miller period completes. In this way, the Miller period is shortened. Note that "before the Miller period completes" may be replaced by "before time t3 at which gate voltage Vgs reaches threshold voltage Vth".

Moreover, third circuit path 7 slowly discharges the gate capacitance after time t3 or after the discharge performed by second circuit path 6 is completed. Since the gate capacitance is slowly discharged at time t4 at which gate voltage Vgs falls below the threshold voltage within a period from time t3 to time t5, the change in drain current Ids is mitigated. This decreases current interruption speed di/dt, thereby reducing a surge voltage.

Figure 3:
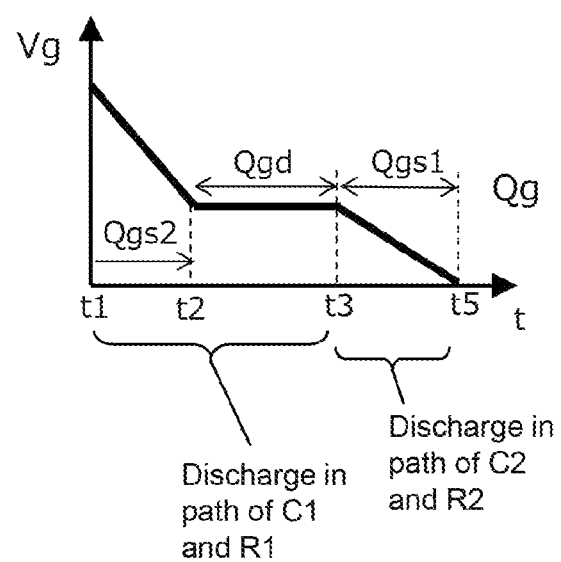
FIG. 3 is a diagram illustrating an example of gate charge characteristics of a power transistor during a turn-off time.

FIG. 3 is a diagram illustrating an example of gate charge characteristics of power transistor 2 during a turn-off time. The horizontal axis of FIG. 3 represents time. The vertical axis represents gate voltage Vg.

The following expression shows electric charge amount Qg (ON) charged in the gate capacitance when power transistor 2 is in the ON state:

$$Qg(ON)=Qgs1+Qgd+Qgs2$$

Here, Qgs1 denotes gate-to-source parasitic capacitance corresponding to a gate voltage lower than a threshold. Qgd denotes gate-to-drain parasitic capacitance. Qgs2 denotes gate-to-source parasitic capacitance corresponding to a gate voltage higher than the threshold.

The capacitance value of first capacitor C1 is set to satisfy the following expression:

$$C1<(Qgs2+Qgd)$$

More precisely, first capacitor C1 is set to satisfy the following expression:

$$C1(Vg(t1)-Vg(t2))<(Qgs2+Qgd)$$

Here, Vg (t1) denotes a gate voltage at time t1 illustrated in FIG. 3. Vg (t2) denotes a gate voltage at time t2 illustrated in FIG. 3. The left-hand side of the expression represents an electric charge amount that is expressed by multiplying a difference between gate voltage Vg at time t1 and gate voltage Vg at time t2 and first capacitor C1 together. First capacitor C1 is set such that an electric charge amount indicated in the left-hand side is less than the right-hand side (Qgs2+Qgd). With this, quick discharge performed by first capacitor C1 and first resistor R1 can be finished before the Miller period ends.

In other words, the electric charge amount to be charged in first capacitor C1 when power transistor 2 is in the ON state is set to be less than (Qgs2+Qgd) among electric charge amount Qg of the gate capacitance of power transistor 2. With this, second circuit path 6 having low resistance can quickly discharge gate charge of power transistor 2 from after the start of turning power transistor 2 off to the middle of the Miller period, thereby shortening the Miller period.

The following expression defines electric charge amount Q (C1_ON) charged in first capacitor C1 when power transistor 2 is in the ON state:

$$Q(C1\_ON)=\text{capacitance value of } C1\times(Vdd-Vgs(ON))$$

Here, Vdd denotes a gate driving supply voltage, and Vgs (ON) denotes a gate-to-source voltage when power transistor 2 is in the ON state.

The capacitance value of second capacitor C2 is set to satisfy the following expression:

$$C2>(Qgs1+Qgd+Qgs2)$$

In other words, the capacitance value of second capacitor C2 is set to be greater than electric charge amount Qg (ON)=Qgs1+Qgd+Qgs2 of the gate capacitance when power transistor 2 is in the ON state.

More precisely, second capacitor C2 is set to satisfy the following expression:

$$C2(Vg(t1)-Vg(t5))<(Qgs1+Qgd+Qgs2)$$

Here, Vg (t1) denotes a gate voltage at time t1 illustrated in FIG. 3. Vg (t5) denotes a gate voltage at time t5 illustrated in FIG. 3. After first capacitor C1 absorbs the electric charge amount of Q (C1_ON) during a process of turning power transistor 2 off, a voltage applied across first capacitor C1 decreases, and an amount of current that flow through first capacitor C1 is less than an amount of current that flow through second capacitor C2. The amount of current that flow through second capacitor C2 can be adjusted by the magnitude of resistance of second resistor R2, thereby adjusting current interruption speed di/dt.

In addition, when power transistor 2 is a p-type gate, gate resistor Rgon is necessary for determining a gate voltage during a time at which power transistor 2 is turned on. However, resistance of gate resistor Rgon needs to be higher than that of second resistor R2. If resistance of gate resistor Rgon is lower than that of second resistor R2, adjustment of current interruption speed di/dt using the resistance value of second resistor R2 will be complicated or difficult.

Furthermore, since diode D1 can de-energize gate resistor Rgon during a time at which power transistor 2 is turned off, it is readily possible for second resistor R2 to adjust current interruption speed di/dt.

Note that in FIG. 2A, C1×R1<C2×R2 may be satisfied, instead of satisfying C1<C2 and R1<R2. Here, C1×R1 denotes a time constant of second circuit path 6, and C2×R2 denotes a time constant of third circuit path 7.

[2. Operation]

Next, operation performed by gate drive circuit 1 will be described.

Figure 4:
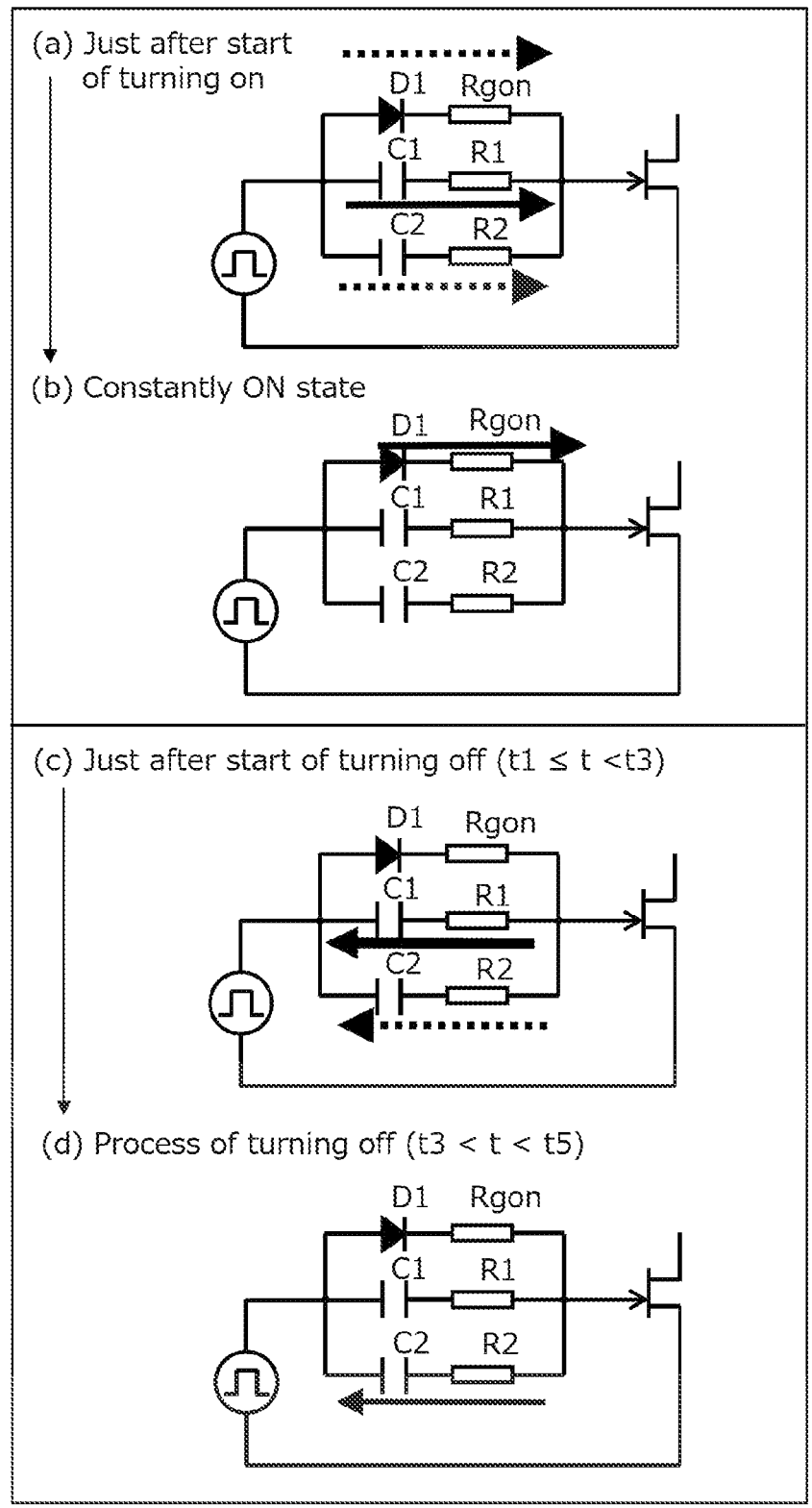
FIG. 4 is a diagram illustrating states of gate currents in the gate drive circuit according to the embodiment.

FIG. 4 is a diagram illustrating states of gate currents in gate drive circuit 1 according to the embodiment. Part (a) of FIG. 4 illustrates gate currents just after the start of turning power transistor 2 on. The bold arrow in the diagram denotes the path of main gate currents. The dotted arrows each denote a path of gate currents in which the amount of current is less than the amount of current that flows through the path denoted by the bold arrow. Just after the start of turning power transistor 2 on, the majority of gate current passes through second circuit path 6, and charges the gate capacitance of power transistor 2. At the same time, part of gate currents passes through first circuit path 5 and third circuit path 7, and charges the gate capacitance of power transistor 2.

Part (b) of FIG. 4 illustrates the steady ON state of power transistor 2. When power transistor 2 is in the ON state, main gate currents can be supplied to the gate via first circuit path 5. In this case, second circuit path 6 and third circuit path 7 do not allow direct gate currents to pass through.

Part (c) of FIG. 4 illustrates the state of gate currents just after the start of turning power transistor 2 off. Just after the start of turning power transistor 2 off is from time t1 to time t3 illustrated in FIG. 2B, for example. Just after the start of turning power transistor 2 off, the majority of gate current flows through first resistor R1 and first capacitor C1 in second circuit path 6, and a minimum amount of gate current flows through second resistor R2 and second capacitor C2 in third circuit path 7. This happens because the resistance value of first resistor R1 is less than that of second resistor R2. Since the gate capacitance is quickly discharged due to gate currents denoted by the bold arrow, it is possible to shorten a Miller period. When first capacitor C1 becomes full, the gate currents denoted by the bold arrow stop flowing into first capacitor C1. The capacitance value of first capacitor C1 is set such that first capacitor C1 becomes full before time t3 illustrated in (b) of FIG. 2B, or in other words, at a point in time at which the Miller period completes or at a point in time at which the Miller period is halfway through.

Part (d) of FIG. 4 illustrates the state of gate currents in a period subsequent to the period illustrated in (c) of FIG. 4. Since the Miller period is completed in (d) of FIG. 4, a gate voltage decreases along with the discharge of electric charge from the gate capacitance. Since first capacitor C1 is full at this time, gate currents do not flow into second circuit path 6. Main gate currents flow through second resistor R2 and second capacitor C2 in third circuit path 7. Since the resistance value of second resistor R2 is greater than that of first resistor R1, gate currents that flow through third circuit path 7 are limited compared to the case in (c) of FIG. 4. With this, current interruption speed di/dt can be decreased, thereby reducing a surge voltage.

[3. Experimental Result]

Next, experimental results obtained by simulating operation performed by gate drive circuit 1 will be described.

Figure 5:
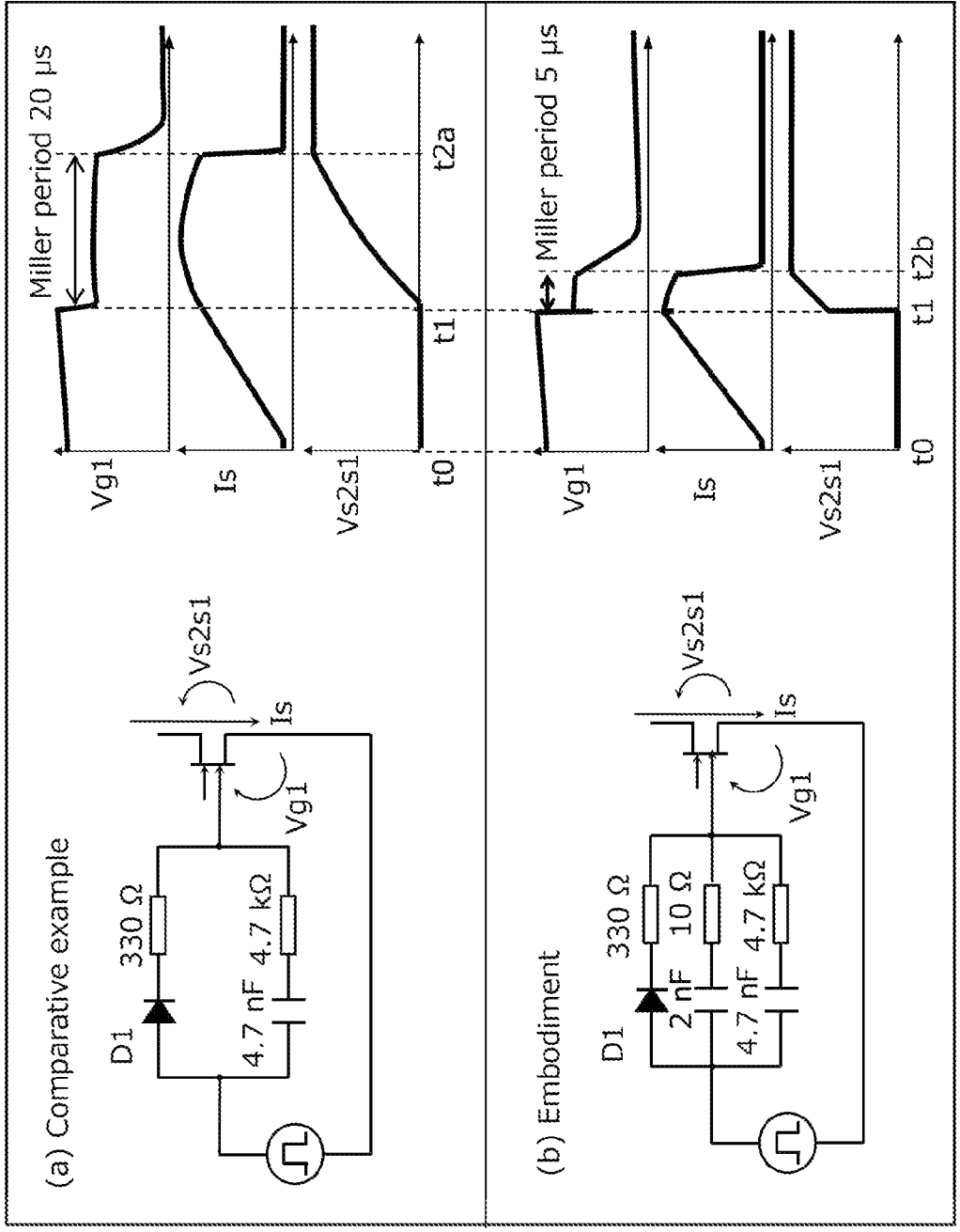
FIG. 5 is a diagram illustrating results of an experiment carried out on a gate drive circuit according to a comparative example and on the gate drive circuit according to the embodiment.

FIG. 5 is a diagram illustrating results of an experiment carried out on a gate drive circuit according to a comparative example and on gate drive circuit 1 according to the embodiment. Part (b) of FIG. 5 illustrates gate drive circuit 1 illustrated in FIG. 2A. As a comparative example, (a) of FIG. 5 illustrates the configuration of a gate drive circuit obtained by excluding second circuit path 6 from gate drive circuit 1 illustrated in (b) of FIG. 5. The excluded second circuit path 6 includes first capacitor C1 and first resistor R1, and is a circuit for quickly discharging the gate capacitance of power transistor 2 during a process of turning power transistor 2 off.

Constants for each of circuit elements illustrated in (a) and (b) of FIG. 5 are set as follows. Gate resistor Rgon in first circuit path 5 is set to 330Ω. First capacitor C1 in second circuit path 6 is set to 2 nF, and first resistor R1 in second circuit path 6 is set to 10Ω. Second capacitor C2 in third circuit path 7 is set to 4.7 nF, and second resistor R2 in third circuit path 7 is set to 4.7 kΩ. Power transistor 2 illustrated in FIG. 5 which is used for the experiment is a GaN bidirectional switch having a p-type dual gate structure.

Waveforms on the right side of each of (a) and (b) of FIG. 5 show, as experimental results of the simulation, gate voltage Vg1, drain-to-source current Is, and drain-to-source voltage Vs2s1. The Miller period from time t1 that is a point in time at which power transistor 2 starts to turn off to time t2a in the comparative example illustrated in (a) of FIG. 5 lasts 20 µs. In contrast, the Miller period from time t1 that is a point in time at which power transistor 2 starts to turn off to time t2b in gate drive circuit 1 according to the embodiment which is illustrated in (b) of FIG. 5 lasts 5 µs.

It has been confirmed that second circuit path 6 illustrated in (b) of FIG. 5 has an effect of shortening the Miller period to a quarter of the Miller period illustrated in (a) of FIG. 5. Moreover, as shown by the waveforms illustrated in (b) of FIG. 5, shortening of the Miller period reduces the amount of drain-to-source current Is in the Miller period, and also reduces drain-to-source voltage Vs2s1. In other words, the possibility of damaging power transistor 2 due to an overcurrent of drain-to-source current Is during a Miller period is reduced.

Next, another experimental result of simulating operation performed by gate drive circuit 1 will be described.

Figure 6:
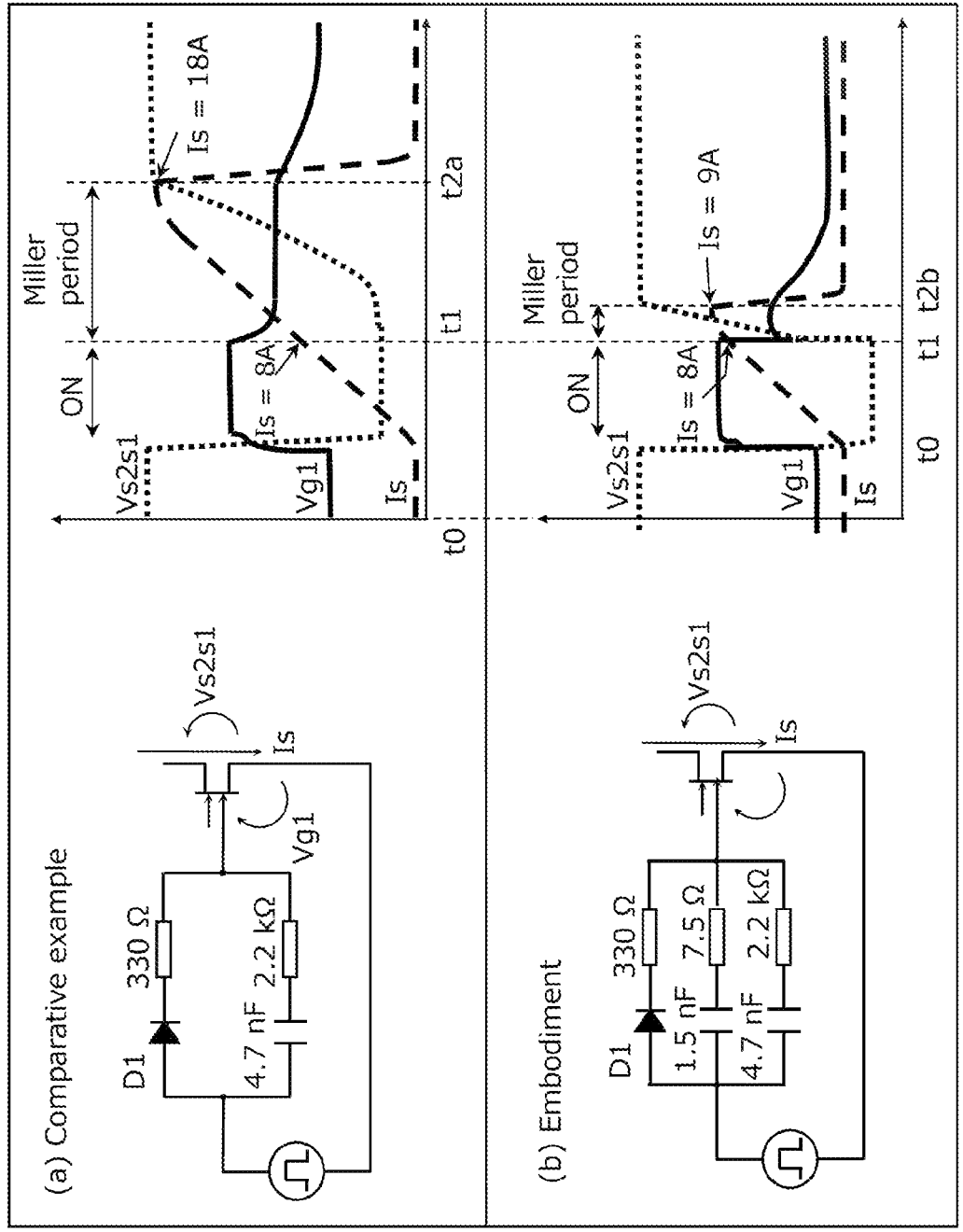
FIG. 6 is a diagram illustrating results of another experiment carried out on a gate drive circuit according to a comparative example and on the gate drive circuit according to the embodiment.

FIG. 6 is a diagram illustrating results of another experiment carried out on a gate drive circuit according to a comparative example and on the gate drive circuit according to the embodiment. Circuit configurations illustrated in (a) and (b) of FIG. 6 are the same as those of (a) and (b) of FIG. 5. However, constants of each of circuit elements illustrated in FIG. 6 are different from those of FIG. 5. Constants for each circuit element illustrated in (a) and (b) of FIG. 6 are determined as follows. Gate resistor Rgon in first circuit path 5 is set to 330Ω. First capacitor C1 in second circuit path 6 is set to 1.5 nF, and first resistor R1 in second circuit path 6 is set to 7.5Ω. Second capacitor C2 in third circuit path 7 is set to 4.7 nF, and second resistor R2 in third circuit path 7 is set to 2.2 kΩ. Like FIG. 5, power transistor 2 illustrated in FIG. 6 which is used for the experiment is a GaN bidirectional switch having a p-type dual gate structure.

The Miller period shown in (b) of FIG. 6 is shortened to approximately a quarter of the Miller period shown in (a) of FIG. 6.

Moreover, drain-to-source current Is at the start of the Miller period illustrated in (a) of FIG. 6 has 8 A, and is increased to 18 A at the end of the Miller period. In contrast, drain-to-source current Is at the start of the Miller period illustrated in (b) of FIG. 6 has 8 A, and is increased to 9 A at the end of the Miller period. The increment is small. As described above, shortening of the Miller period illustrated in (b) of FIG. 6 greatly reduces the amount of drain-to-source current Is in the Miller period. In other words, the possibility of damaging power transistor 2 due to an overcurrent of drain-to-source current Is during the Miller period is greatly reduced.

[Variation 1]

Next, Variation 1 of gate drive circuit 1 will be described.

Figure 7A:
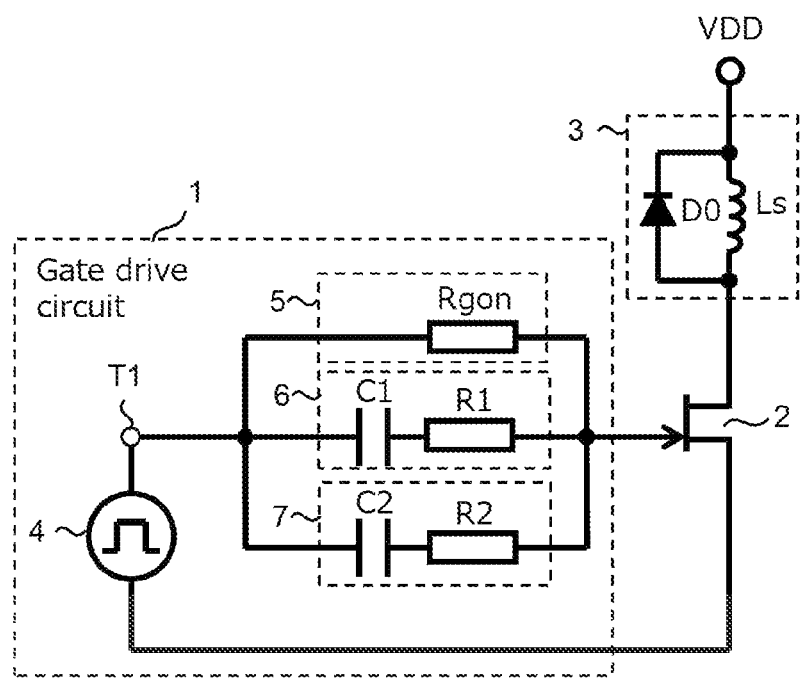
FIG. 7A is a diagram illustrating an example of a configuration of a power switching system including Variation 1 of the gate drive circuit according to the embodiment.

FIG. 7A is a diagram illustrating an example of a configuration of a power switching system including Variation 1 of the gate drive circuit according to the embodiment. FIG. 7A and FIG. 2A are different in that Variation 1 of the gate drive circuit illustrated in FIG. 7A does not include diode D1 in first circuit path while the gate drive circuit according to the embodiment illustrated in FIG. 2A includes diode D1 in first circuit path 5. In order to avoid redundant description, the following mainly describes points different from the embodiment.

Since diode D1 is excluded from first circuit path 5, first circuit path 5 allows gate currents due to the discharge of electric charge from the gate capacitance of power transistor 2 to pass through during a process of turning power transistor 2 off. However, since the resistance value of gate resistor Rgon is sufficiently greater than that of second resistor R2, gate currents that flow through first circuit path 5 can be disregarded, when compared to gate currents that flow through second circuit path 6. Accordingly, gate drive circuit 1 according to Variation 1 which is illustrated in FIG. 7A can also perform the same operation and demonstrate the same effect as gate drive circuit 1 illustrated in FIG. 2A.

Furthermore, an example of operation performed by gate drive circuit 1 according to Variation 1 will be described.

Figure 7B:
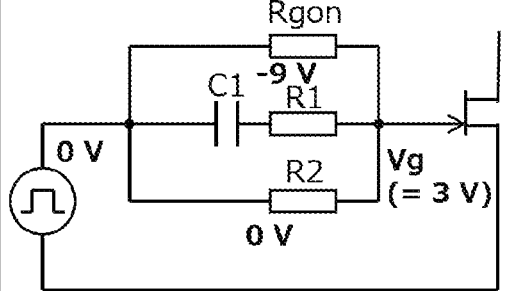
FIG. 7B is a diagram illustrating operation performed by Variation 1 of the gate drive circuit and the gate drive circuit according to the comparative example.

FIG. 7B is a diagram illustrating operation performed by the gate drive circuits according to Variation 1 and the comparative example. Part (a) of FIG. 7B illustrates gate voltage Vg and gate current Ig at the start of turning gate drive circuit 1 according to Variation 1 off (i.e., the end of the ON state). Part (b) and (c) of FIG. 7B correspond to a slow discharge period during which third circuit path 7 slowly discharges the gate capacitance. That is, (b) of FIG. 7B illustrates gate voltage Vg and gate current Ig just after the quick discharge performed by second circuit path 6 is completed. Part (c) of FIG. 7B illustrates gate voltage Vg and gate current Ig in the slow discharge period during which third circuit path 7 slowly discharges the gate capacitance. Note that Ig@R2 shown in FIG. 7B denotes gate current Ig that flows through second resistor R2.

Moreover, as a precondition, a comparative example of FIG. 7B illustrates an example of a circuit obtained by excluding second capacitor C2 from gate drive circuit 1 according to Variation 1 illustrated in FIG. 7A. Part (a1) of FIG. 7B illustrates gate voltage Vg and gate current Ig at the start of turning the gate drive circuit according to the comparative example off (i.e., the end of the ON state). Part (b1) and (c1) of FIG. 7B correspond to a slow discharge period during which second resistor R2 slowly discharges the gate capacitance. That is, (b1) of FIG. 7B illustrates gate voltage Vg and gate current Ig just after the quick discharge performed by second circuit path 6 is completed. Part (c1) of FIG. 7B illustrates gate voltage Vg and gate current Ig in the slow discharge period during which third circuit path 7 slowly discharges the gate capacitance.

During the slow discharge period (a period from (b) to (c)) according to Variation 1, gate current Ig@R2 changes from 11 V/R2 to 10 V/R2. That is, the rate of change in Ig is approximately 9%. In other words, current interruption speed di/dt is comparatively low. With this, a surge voltage can be reduced, thereby reducing the possibility of damaging power transistor 2.

In contrast, gate current Ig@R2 changes from 2 V/R2 to 1 V/R2 during the slow discharge period (a period from (b1) to (c1)) according to the comparative example. That is, the rate of change in Ig is approximately 50%. In other words, current interruption speed di/dt is comparatively high. This produces a subtle effect on a reduction of a surge voltage, and therefore an effect of reducing the possibility of damaging power transistor 2 is also subtle.

[Variation 2]

Next, Variation 2 of gate drive circuit 1 will be described.

Figure 8A:
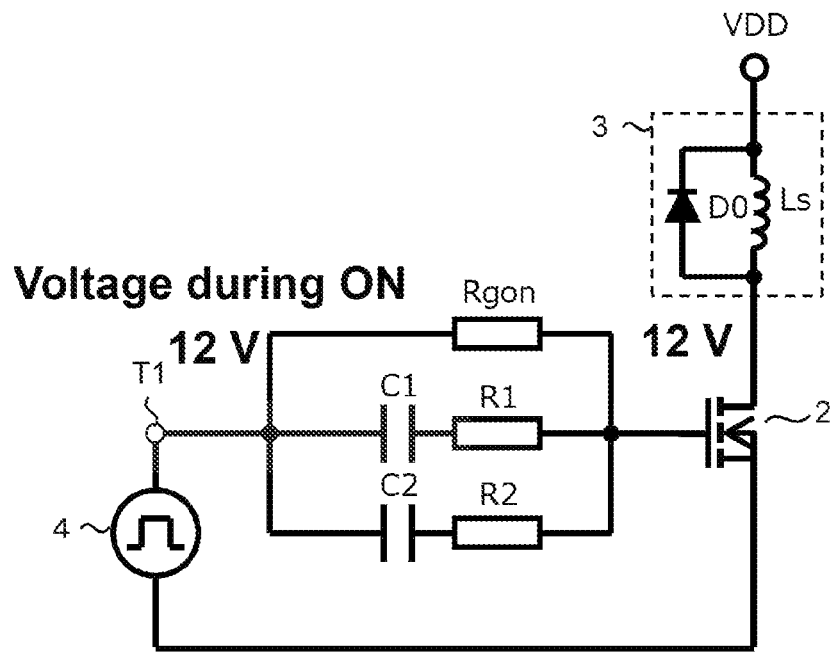
FIG. 8A is a diagram illustrating an example of a configuration of a power switching system including Variation 2 of the gate drive circuit according to the embodiment.

FIG. 8A is a diagram illustrating an example of a configuration of a power switching system including Variation 2 of the gate drive circuit according to the embodiment. FIG. 8A and FIG. 7A are different in that Variation 2 of the gate drive circuit illustrated in FIG. 8A includes power transistor 2 which is a MOSFET, while Variation 1 of the gate drive circuit illustrated in FIG. 7A includes power transistor 2 that is not a MOSFET. Specifically, power transistor 2 illustrated in FIG. 8A is not a gate insulated transistor (GIT) whose gate portion is a diode, but is a MOSFET having an insulated gate. In this case, a gate voltage when power transistor 2 is in the ON state increases up to the voltage of input terminal T1, since Variation 2 of the gate drive circuit illustrated in FIG. 8A includes gate resistor Rgon.

Figure 8B:
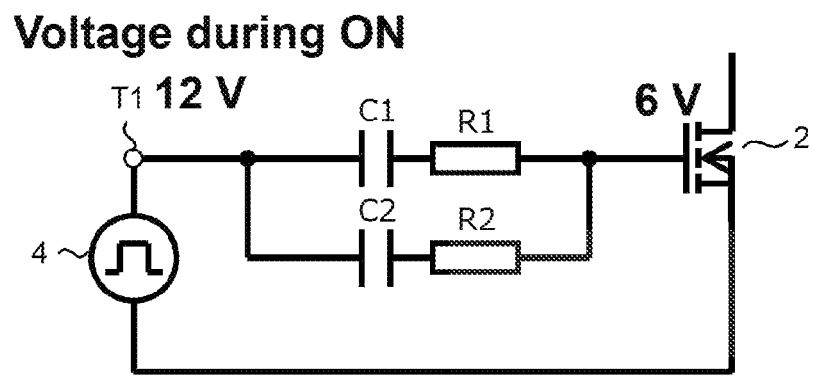
FIG. 8B is a diagram illustrating operation performed by the gate drive circuit according to a comparative example which includes an FET as a power transistor.

If gate resistor Rgon is not provided as illustrated in FIG. 8B, a gate voltage when power transistor 2 is in the ON state depends on the capacitance ratio between (i) capacitance of first capacitor C1 and second capacitor C2 and (ii) the gate capacitance. Accordingly, the gate voltage has a voltage value of a partial voltage of input terminal T1. FIG. 8B illustrates an example in which the gate voltage is 6 V as a result of 12 V of voltage of input terminal T1 being divided.

Figure 8C:
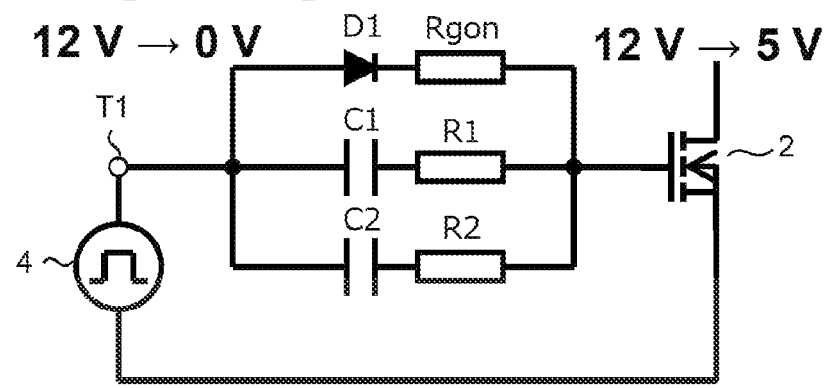
FIG. 8C is a diagram illustrating operation performed by the gate drive circuit according to the embodiment which includes an FET as a power transistor.

If diode D1 is connected in series to gate resistor Rgon as illustrated in FIG. 8C, a failure that gate voltage Vg of the MOSFET can never drops to zero may occur, since a path for discharging electric charge accumulated in the gate capacitance is not provided. However, if second capacitor C2 is not provided in FIG. 8C, the electric charge of the gate capacitance can be discharged.

As described, if power transistor 2 is a MOSFET, the configuration illustrated in FIG. 8A and the configuration illustrated in FIG. 8C without second capacitor C2 are suitable for a gate drive circuit.

Note that since a p-type gate, such as a gate of a GaN bidirectional switch, is a gate that is itself a p-n diode, gate charge can be naturally discharged through the p-n diode. Accordingly, the configuration illustrated in FIG. 8C is also suitable for a gate driving circuit.

[Variation 3]

Next, Variation 3 of gate drive circuit 1 will be described.

Figure 9A:
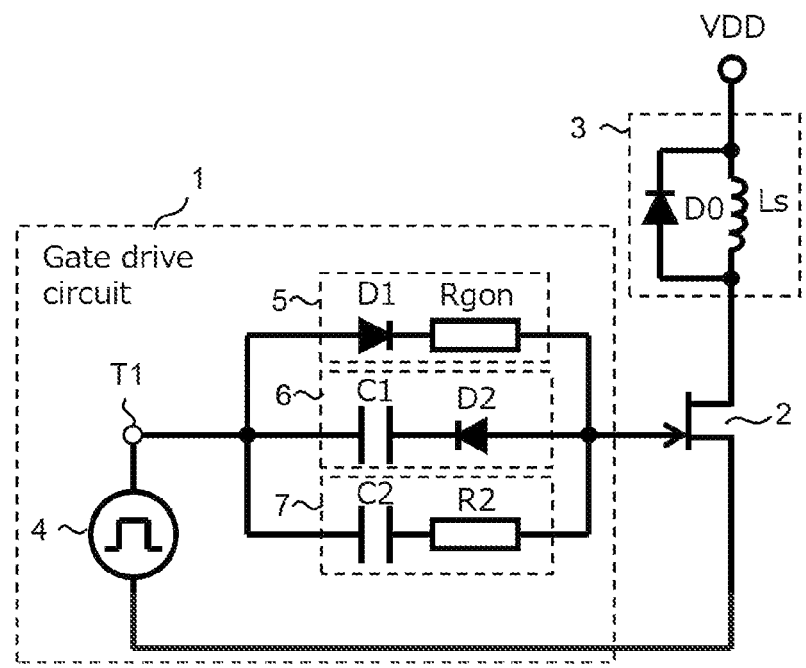
FIG. 9A is a diagram illustrating an example of a configuration of a power switching system including Variation 3 of the gate drive circuit according to the embodiment.

FIG. 9A is a diagram illustrating an example of a configuration of a power switching system including Variation 3 of the gate drive circuit according to the embodiment. FIG. 9A and FIG. 2A are different in that Variation 3 of the gate drive circuit illustrated in FIG. 9A includes diode D2 instead of first resistor R1, while the gate drive circuit according to the embodiment illustrated in FIG. 2A includes first resistor R1. Hereinafter, points different from the embodiment will be mainly described.

Diode D2 is provided instead of first resistor R1 which has low resistance and is used for quick discharge of electric charge. Diode D2 enables, in the same manner as first resistor R1, quick discharge of electric charge during a turn-off time of the power transistor.

According to Variation 3, it is possible to further reduce ringing of a source current and a gate voltage which occurs during a turn-on time of the power transistor. Moreover, by providing diode D2, almost no current flows from first capacitor C1 for charging the gate capacitance during a process of turning the power transistor on in Variation 3. Instead, gate currents during the process of turning the power transistor on flow through diode D1 and gate resistor Rgon. A resistance value set for gate resistor Rgon can adjust the speed of turning the power transistor on, separately from adjusting current interruption speed di/dt during a turn-off time of the power transistor.

In addition, the main path for gate currents during the process of turning the power transistor on is either second resistor R2 or gate resistor Rgon, whichever has a smaller resistance value than the other. Note that currents momentarily flow through diode D2 since diode D2 itself has capacitance. However, since the capacitance value of diode D2 is typically less than the capacitance value of first capacitor C1, the flow of currents through diode D2 can be disregarded.

Figure 9B:
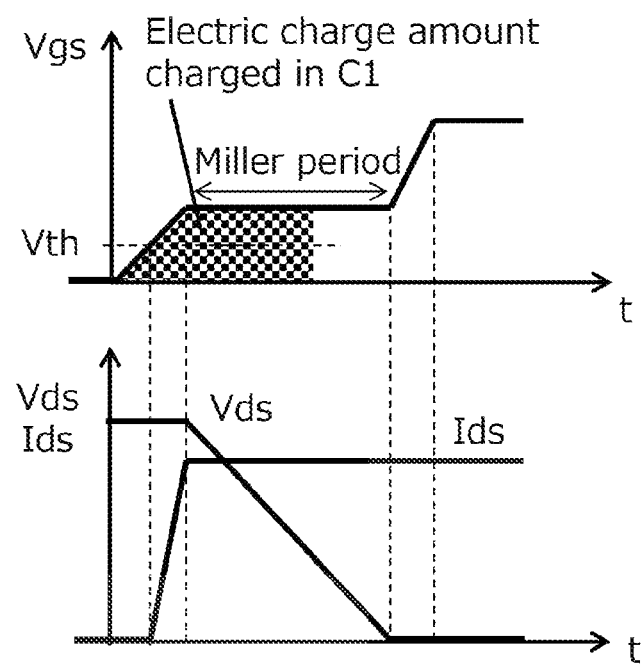
FIG. 9B is a diagram illustrating operation performed by Variation 3 of the gate drive circuit according to the embodiment.

FIG. 9B is a diagram illustrating operation performed by Variation 3 of the gate drive circuit according to the embodiment. FIG. 9B illustrates a waveform of each of gate voltage Vgs, drain voltage Vds, and drain current Ids during the process of turning power transistor 2 on. Since Variation 3 of the gate drive circuit includes diode D2 instead of first resistor R1, the quick charge of gate capacitance performed by first capacitor C1 and first resistor R1 during a turn-on time is prohibited. With this, a resistance value set for gate resistor Rgon can readily adjust the speed of turning the power transistor on.

[Variation 4]

Next, Variation 4 of gate drive circuit 1 will be described.

Figure 10:
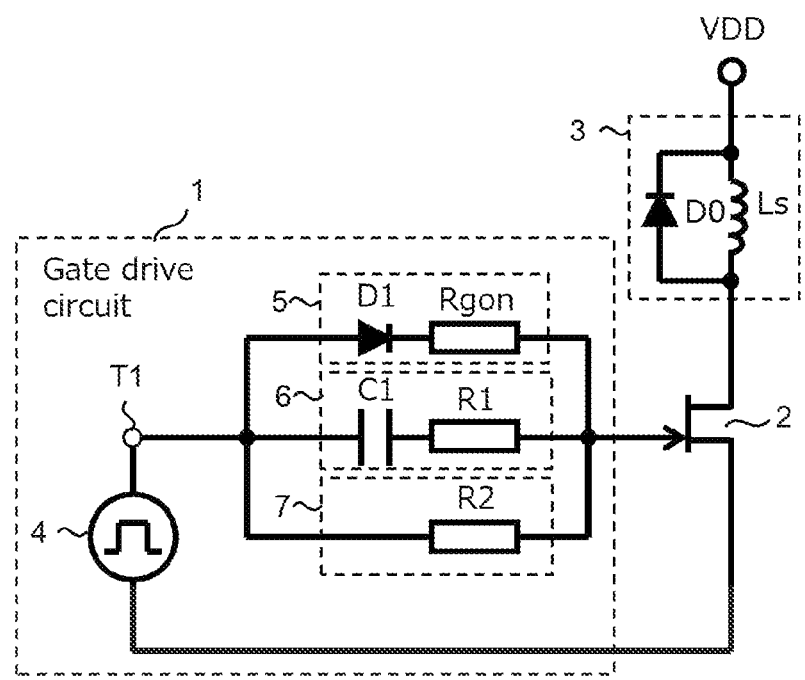
FIG. 10 is a diagram illustrating an example of a configuration of a power switching system including Variation 4 of the gate drive circuit according to the embodiment.

FIG. 10 is a diagram illustrating an example of a configuration of a power switching system including Variation 4 of the gate drive circuit according to the embodiment. FIG. 10 and FIG. 2A are different in that the gate drive circuit illustrated in FIG. does not include second capacitor C2, while gate drive circuit 1 illustrated in FIG. 2A includes second capacitor C2. Hereinafter, points different from the embodiment will be mainly described.

Third circuit path 7 does not include second capacitor C2, and includes second resistor R2. Gate currents can constantly flow between input terminal T1 and the gate, without direct current interruption acted upon by second capacitor C2. Third circuit path 7 can discharge gate charge without the residue when power transistor 2 is in the OFF state. For this reason, gate drive circuit 1 illustrated in FIG. 10 is suitable for a gate drive circuit when power transistor 2 is a MOSFET having an insulated gate, for example. Although the gate drive circuit does not include second capacitor C2 as illustrated in FIG. 10, Variation 4 of the gate drive circuit can implement shortening of a Miller period and a decrease in current interruption speed di/dt in the same manner as gate drive circuit 1 illustrated in FIG. 2A.

[Variation 5]

Next, Variation 5 of gate drive circuit 1 will be described.

Figure 11A:
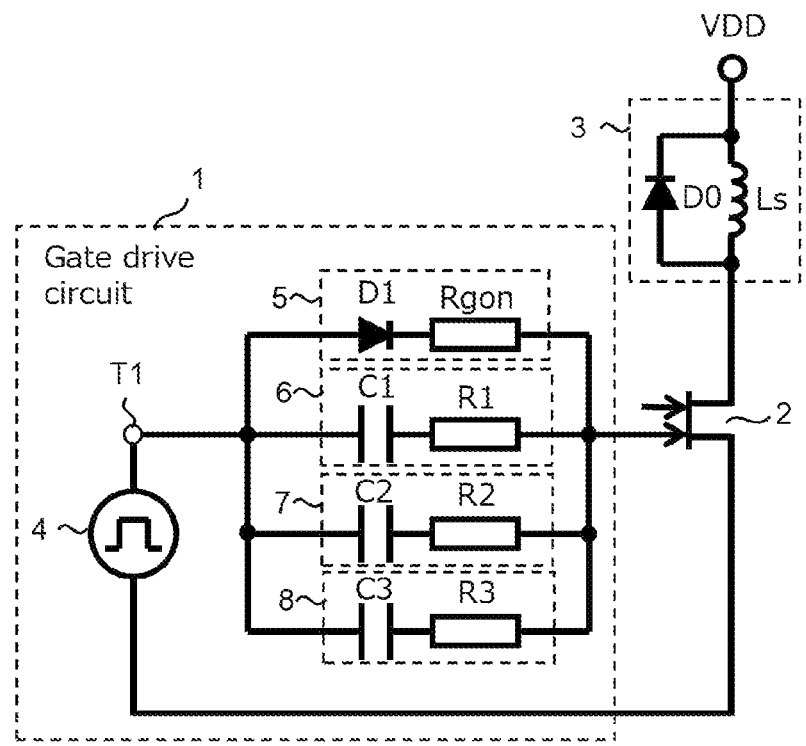
FIG. 11A is a diagram illustrating an example of a configuration of a power switching system including Variation 5 of the gate drive circuit according to the embodiment.

FIG. 11A is a diagram illustrating an example of a configuration of a power switching system including Variation 5 of the gate drive circuit according to the embodiment. In addition, FIG. 11B is a diagram illustrating operation performed by Variation of the gate drive circuit according to the embodiment.

FIG. 11A and FIG. 2A are different in that the gate drive circuit illustrated in FIG. 11A includes fourth circuit path 8, while gate drive circuit 1 illustrated in FIG. 2A does not include fourth circuit path 8. Hereinafter, points different from the embodiment will be mainly described.

Fourth circuit path 8 is connected in parallel to third circuit path 7. Fourth circuit path 8 includes third capacitor C3 and third resistor R3 connected in series. Here, the capacitance value of third capacitor C3 is greater than that of second capacitor C2. The resistance value of third resistor R3 is greater than that of second resistor R2.

Figure 11B:
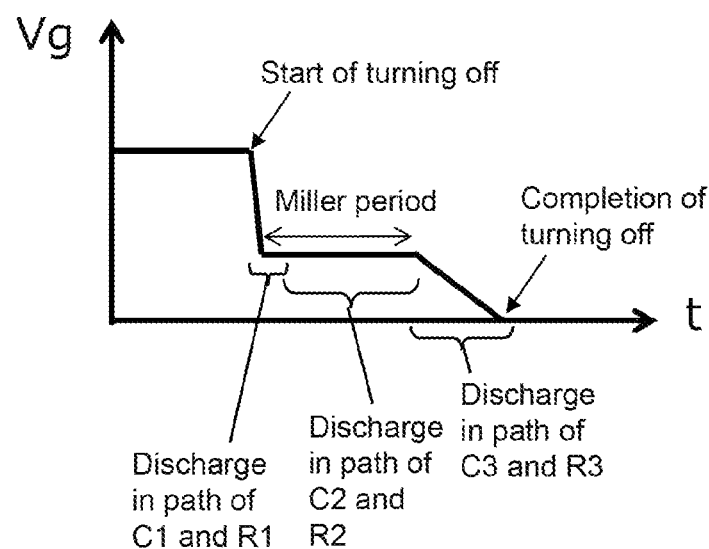
FIG. 11B is a diagram illustrating operation performed by Variation 5 of the gate drive circuit according to the embodiment.

In the example of operation illustrated in FIG. 11B, second circuit path 6 extremely quickly discharges the gate capacitance during a period from the start of turning the power transistor off to the first part of the Miller period. Third circuit path 7 quickly discharges the gate capacitance mainly during the Miller period. Fourth circuit path 8 slowly discharges the gate capacitance mainly during a period from the last part of the Miller period to the completion of turning the power transistor off. Accordingly, capacitance values and resistance values are to satisfy the following expressions.

$$C1 < C2 < C3$$

$$R1 < R2 < R3 < Rgon$$

With this, main gate currents flow through first capacitor C1, second capacitor C2, and third capacitor C3 in the stated order during the process of turning the power resistor off. Then, the capacitors are brought into the full state in the above stated order, and the currents to the capacitors are interrupted. Even if the Miller period cannot be sufficiently shortened by only first capacitor C1, second capacitor C2 can sufficiently shorten or adjust the Miller period. Current interruption speed di/dt after the Miller period can be readily adjusted by third capacitor C3.

Note that in FIG. 11A, instead of C1<C2<C3 and R1<R2<R3, the capacitance values and the resistance values may satisfy C1×R1<C2×R2<C3×R3. Here, C1×R1 is a time constant of second circuit path 6, C2×R2 is a time constant of third circuit path 7, and C3×R3 is a time constant of fourth circuit path 8.

As has been describe above, gate drive circuit 1 according to an aspect of the embodiment includes: input terminal T1; first circuit path 5 inserted into a line connecting input terminal T1 and a gate of power transistor 2; second circuit path 6 connected in parallel to first circuit path 5; and third circuit path 7 connected in parallel to second circuit path 6. First circuit path 5 includes gate resistor Rgon, second circuit path 6 includes first capacitor C1 and first resistor R1 connected in series, and third circuit path 7 includes second capacitor C2 and second resistor R2 connected in series. Second capacitor C2 has a capacitance value greater than a capacitance value of first capacitor C1. Second resistor R2 has a resistance value greater than a resistance value of first resistor R1. Gate resistor Rgon has a resistance value greater than the resistance value of second resistor R2.

With this, it is possible to shorten a Miller period and to reduce a surge voltage (i.e., a decrease in current interruption speed di/dt). In other words, reliability of power transistor 2 can be increased.

Here, second circuit path 6 may discharge part of electric charge from gate capacitance of power transistor 2 during a process of turning power transistor 2 off. Subsequent to second circuit path 6 discharging the part of the electric charge, third circuit path 7 may discharge another part of the electric charge from the gate capacitance at a speed slower than a speed of second circuit path 6 discharging the part of the electric charge.

Accordingly, the quick discharge performed by second circuit path 6 can shorten a Miller period. Slow discharge performed by third circuit path 7 can decrease current interruption speed di/dt, thereby reducing a surge voltage.

Here, second circuit path 6 may discharge a first electric charge amount from gate capacitance of power transistor 2 during a process of turning power transistor 2 off. The first electric charge amount may be set to be less than a second electric charge amount that is discharged from the gate capacitance of power transistor 2 from a start of turning power transistor 2 off until a Miller period of power transistor 2 is completed.

Accordingly, a period during which the quick discharge is performed by second circuit path 6 can be set within a Miller period.

Here, first circuit path 5 may include diode D1 connected in series to gate resistor Rgon. A forward direction of diode D1 may be from the input terminal toward the gate of the power transistor.

Accordingly, the resistance value of gate resistor Rgon in first circuit path 5 hardly contributes to the discharge of electric charge during the turning off of power transistor 2, since the resistance value of gate resistor Rgon in first circuit path 5 is greater than that of second resistor R2. For this reason, second circuit path 6 and third circuit path 7 can exclusively set and adjust operation performed during the turning off of power transistor 2.

Here, fourth circuit path 8 connected in parallel to third circuit path 7 may be further included. Fourth circuit path 8 may include third capacitor C3 and third resistor R3 connected in series. Third capacitor C3 may have a capacitance value greater than the capacitance value of second capacitor C2. Third resistor R3 may have a resistance value greater than the resistance value of second resistor R2.

Accordingly, third circuit path 7 can readily adjust a Miller period for shortening the Miller period, and fourth circuit path 8 can readily adjust current interruption speed di/dt, for example.

Here, power transistor 2 may have a p-type gate structure.

Here, power transistor 2 may be a GaN bidirectional switch having a p-type dual gate structure.

Here, power transistor 2 may be a MOSFET.

In addition, gate drive circuit 1 according to an aspect of the embodiment includes: input terminal T1; first circuit path 5 inserted into a line connecting input terminal T1 and a gate of power transistor 2; second circuit path 6 connected in parallel to first circuit path 5; and third circuit path 7 connected in parallel to second circuit path 6. First circuit path 5 includes gate resistor Rgon, second circuit path 6 includes first capacitor C1 and diode D2 connected in series, and third circuit path 7 includes second capacitor C2 and second resistor R2 connected in series. Second capacitor C2 has a capacitance value greater than a capacitance value of first capacitor C1. Gate resistor Rgon has a resistance value greater than a resistance value of second resistor R2.

With this, it is possible to shorten a Miller period and to reduce a surge voltage (i.e., a decrease in current interruption speed di/dt). In other words, reliability of power transistor 2 can be increased.

Here, second circuit path 6 may discharge a first electric charge amount from gate capacitance of power transistor 2 during a process of turning power transistor 2 off. The first electric charge amount may be set to be less than a second electric charge amount that is discharged from the gate capacitance of power transistor 2 from a start of turning power transistor 2 off until a Miller period of power transistor 2 is completed.

Accordingly, a period during which the quick discharge is performed by second circuit path 6 can be set within the Miller period.

Here, first circuit path 5 may include diode D1 connected in series to gate resistor Rgon.

Accordingly, the resistance value of gate resistor Rgon in first circuit path 5 hardly contributes to the discharge of electric charge during the turning off of power transistor 2, since the resistance value of gate resistor Rgon in first circuit path 5 is greater than that of second resistor R2. For this reason, second circuit path 6 and third circuit path 7 can exclusively set and adjust operation performed during the turning off of power transistor 2.

Here, a forward direction of diode D1 in first circuit path 5 may be from input terminal T1 toward the gate of the power transistor, and a forward direction of diode D2 in second circuit path 6 may be from the gate of the power transistor toward input terminal T1.

In addition, gate drive circuit 1 according to an aspect of the embodiment includes: input terminal T1; first circuit path 5 inserted into a line connecting input terminal T1 and a gate of power transistor 2; second circuit path 6 connected in parallel to first circuit path 5; and third circuit path 7 connected in parallel to second circuit path 6. First circuit path 5 includes diode D1 and gate resistor Rgon connected in series, second circuit path 6 includes first capacitor C1 and first resistor R1 connected in series, and third circuit path 7 includes second resistor R2. Second resistor R2 has a resistance value greater than a resistance value of first resistor R1. Gate resistor Rgon has a resistance value greater than the resistance value of second resistor R2.

With this, it is possible to shorten a Miller period and to reduce a surge voltage (i.e., a decrease in current interruption speed di/dt). In other words, reliability of power transistor 2 can be increased.

Here, second circuit path 6 may discharge a first electric charge amount from gate capacitance of power transistor 2 during a process of turning power transistor 2 off. The first electric charge amount may be set to be less than a second electric charge amount that is discharged from the gate capacitance of power transistor 2 from a start of turning power transistor 2 off until a Miller period of power transistor 2 is completed.

Accordingly, a period during which the quick discharge is performed by second circuit path 6 can be set within the Miller period.

In addition, a semiconductor breaker according to an aspect of the embodiment includes the above-described gate drive circuit 1, and power transistor 2.

With this, it is possible to shorten a Miller period and to reduce a surge voltage (i.e., a decrease in current interruption speed di/dt). In other words, reliability of power transistor 2 can be increased.

Hereinbefore, the gate drive circuit according to one or more aspects have been described based on the embodiments; however, the present disclosure is not limited to these embodiments. Without departing from the scope of the present disclosure, various modifications which may be conceived by a person skilled in the art, and embodiments achieved by combining elements in different embodiments may be encompassed within the scope of the one or more aspects.

INDUSTRIAL APPLICABILITY

A gate drive circuit and a semiconductor breaker according to the present disclosure is applicable to, for example, a power switching system.

REFERENCE SIGNS LIST 1 gate drive circuit
2 power transistor
3 load circuit
4 control circuit
5 first circuit path
6 second circuit path
7 third circuit path
8 fourth circuit path
C1 first capacitor
C2 second capacitor
C3 third capacitor
D1, D2 diode
R1 first resistor
R2 second resistor
R3 third resistor
Rgon gate resistor
T1 input terminal

The invention claimed is:

1. A gate drive circuit comprising:
an input terminal;
a first circuit path inserted into a line connecting the input terminal and a gate of a power transistor;
a second circuit path; and
a third circuit path, wherein:
the first circuit path includes a diode and a gate resistor connected in series,
the second circuit path includes a first capacitor and a first resistor connected in series,
the third circuit path includes a second resistor,
the diode and the gate resistor connected in series are connected in parallel to the first capacitor and the first resistor connected in series,
the first capacitor and the first resistor connected in series are connected in parallel to the second resistor,
the second resistor has a resistance value greater than a resistance value of the first resistor, and
the gate resistor has a resistance value greater than the resistance value of the second resistor.

2. A semiconductor breaker comprising:
the gate drive circuit according to claim 1; and
the power transistor.

3. A gate drive circuit comprising:
an input terminal;
a first circuit path inserted into a line connecting the input terminal and a gate of a power transistor;
a second circuit path connected in parallel to the first circuit path; and
a third circuit path connected in parallel to the second circuit path, wherein:
the first circuit path includes a diode and a gate resistor connected in series,
the second circuit path includes a first capacitor and a first resistor connected in series,
the third circuit path includes a second resistor,
the second resistor has a resistance value greater than a resistance value of the first resistor,
the gate resistor has a resistance value greater than the resistance value of the second resistor,
the second circuit path discharges a first electric charge amount from gate capacitance of the power transistor during a process of turning the power transistor off, and
the first electric charge amount is set to be less than a second electric charge amount that is discharged from the gate capacitance of the power transistor from a start of turning the power transistor off until a Miller period of the power transistor is completed.

4. A semiconductor breaker comprising:
the gate drive circuit according to claim 3; and
the power transistor.

* * * * *